(12) United States Patent
Park

(10) Patent No.: US 10,861,909 B2
(45) Date of Patent: Dec. 8, 2020

(54) DISPLAY DEVICE AND METHOD FOR MANUFACTURING THE SAME

(71) Applicant: LG Display Co., Ltd., Seoul (KR)

(72) Inventor: Jin-Ho Park, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/431,407

(22) Filed: Jun. 4, 2019

(65) Prior Publication Data

US 2020/0075692 A1    Mar. 5, 2020

(30) Foreign Application Priority Data

Aug. 31, 2018    (KR) .......................... 10-2018-0103929

(51) Int. Cl.
*H01L 27/32* (2006.01)
*H01L 51/52* (2006.01)

(52) U.S. Cl.
CPC ...... *H01L 27/3244* (2013.01); *H01L 27/3211* (2013.01); *H01L 51/5253* (2013.01)

(58) Field of Classification Search
CPC ............. H01L 27/3211; H01L 27/3244; H01L 51/5253
See application file for complete search history.

(56) References Cited

U.S. PATENT DOCUMENTS

| | | | |
|---|---|---|---|
| 2014/0312321 A1* | 10/2014 | Yoo .................... | H04N 5/23241 257/40 |
| 2015/0287951 A1* | 10/2015 | Yamamoto .......... | H01L 51/5004 257/40 |
| 2017/0237037 A1* | 8/2017 | Choi ..................... | H01L 27/323 257/40 |
| 2017/0288004 A1* | 10/2017 | Kim .................... | H01L 27/3276 |

* cited by examiner

*Primary Examiner* — Peniel M Gumedzoe
(74) *Attorney, Agent, or Firm* — Birch, Stewart, Kolasch & Birch, LLP

(57) ABSTRACT

A display device can include a substrate having an active area and a peripheral area surrounding the active area; a camera hole disposed in the active area of the substrate; a plurality of subpixels disposed in the active area while being spaced apart from the camera hole by a first distance, the plurality of subpixels including a plurality of light emitting layers, respectively; and at least one organic common layer disposed on or under the plurality of light emitting layers, in which the at least one organic common layer includes an intermittent portion corresponding to a second distance from the camera hole, the second distance being less than or equal to the first distance.

21 Claims, 13 Drawing Sheets

DISPLAY DEVICE AND METHOD FOR MANUFACTURING THE SAME

CROSS-REFERENCE TO RELATED APPLICATIONS

This application claims the benefit of Korean Patent Application No. 10-2018-0103929, filed in the Republic of Korea on Aug. 31, 2018, which is hereby incorporated by reference as if fully set forth herein.

BACKGROUND OF THE INVENTION

Field of the Invention

The present invention relates to a display device, and more particularly to a display device having a structure including a camera in an active area while securing reliability, and a method for manufacturing the same.

Discussion of the Related Art

With the recent progress of an information-dependent society, the field of displays to visually express electric information signals has rapidly been developed. As a result, various flat display devices having superior performance of thinness, lightness, and low power consumption have been developed to rapidly substitute for cathode ray tubes (CRTs).

Examples of such flat display devices include a liquid crystal display (LCD) device, a plasma display panel (PDP) device, a field emission display (FED) device, an electroluminescent display (ELD) device, an organic light emitting display device and the like.

Among these displays, an organic light emitting display device is considered an application having competitiveness in that it does not require a separate backlight source while achieving compactness and distinct color display.

In addition, organic light emitting display devices are applied to various display devices, such as televisions, smartphones, electronic books, monitors, notebook computers, etc. Furthermore, such an organic light emitting display device is coupled to a camera, to achieve not only screen display, but also checking and editing of a photographed image.

In connection with this, a camera and a display panel, which are included in a display device, are manufactured in separate processes, respectively, and, as such, the display device is generally configured to have a structure in which the camera is accommodated in a bezel part provided at a peripheral portion of the display panel.

In this situation, however, due to a module configuration for driving of the camera, the bezel part disposed at the peripheral portion of the display panel inevitably protrudes, or the peripheral portion of the display panel inevitably has an increased portion to be hidden. For this reason, the entire structure of the display device may be thickened, and the visual sense of the user may be degraded. To this end, efforts have been made to solve such problems.

SUMMARY OF THE INVENTION

Accordingly, the present invention is directed to a display device and a method for manufacturing the same that substantially obviate one or more problems due to limitations and disadvantages of the related art.

An object of the present invention is to provide a display device capable of securing reliability while having a structure including a camera in an active area, and a method for manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display device includes a substrate having an active area and a peripheral area surrounding the active area, a camera hole disposed in the active area of the substrate, and a plurality of subpixels disposed in an entirety of the active area while being spaced apart from the camera hole by a first distance, the subpixels including a plurality of light emitting layers, respectively, in which an organic common layer is disposed at at least one of upper and lower surfaces of the light emitting layer in each of the subpixels, and has the camera hole and an intermittent portion spaced apart from the camera hole by a second distance equal to or smaller than the first distance.

The organic common layer can have an integrated structure in the active area, except for the intermittent portions (e.g., bare spots where the parts of the organic common layer has been removed) and the camera hole.

The organic common layer can include a first organic common layer disposed at the lower surface of the light emitting layer, and a second organic common layer disposed at the upper surface of the light emitting layer. The first organic common layer can contact a first electrode in each of the subpixels. The second organic common layer can contact a second electrode in each of the subpixels.

The second electrode can have an intermittent portion having the same shape as the intermittent portion of the second organic common layer.

The second organic common layer can cover the first organic common layer in the peripheral area. The second electrode can cover the second organic common layer in the peripheral area.

The organic common layer can be removed from an area surrounding the camera hole while extending from an edge of the camera hole by the second distance.

The display device can further include a buffer layer formed over the substrate, and provided with an anti-crack pattern in an area disposed adjacent to the camera hole while extending from the camera hole by the second distance.

The anti-crack pattern can include grooves arranged in the buffer layer in a plurality of columns or a plurality of rows.

The anti-crack pattern can include one or more grooves arranged in the buffer layer while having a horizontal zig-zag shape.

The buffer layer can include a plurality of inorganic stacks disposed most adjacent to the substrate while having a multilayer structure, and an active buffer layer formed on the plural inorganic stacks while being disposed over or beneath a semiconductor layer provided in the active area.

The display device can further include a dam pattern disposed in an area disposed adjacent to the camera hole while extending from the camera hole by the second distance such that the dam pattern is spaced apart from the camera hole and the organic common layer.

The subpixels can be divided from one another by banks, respectively. The dam pattern can be made of the same material as the banks.

The display device can further include a barrier layer formed over the substrate, to cover the active area including the subpixels and the peripheral area. The barrier layer can contact the buffer layer in an area disposed adjacent to the camera hole while extending from the camera hole by the second distance.

The barrier layer can include at least one organic layer and at least one inorganic layer.

The camera hole can contact only the inorganic layer of the barrier layer at an edge thereof.

The display device can further include a camera module including a camera lens corresponding to the camera hole, and a camera bezel for supporting the camera lens while having a driver. The camera bezel can overlap with the substrate by the first distance beneath the substrate.

The substrate can be a flexible substrate.

The display device can further include a thin film transistor formed at an interlayer between the buffer layer and the first electrode such that the thin film transistor is connected to the first electrode.

In another aspect of the present invention, a method for manufacturing a display device includes preparing a substrate having an active area and a peripheral area surrounding the active area, defining a camera hole formation area and a plurality of subpixels in the active area, except for an area surrounding the camera hole formation area while extending from the camera hole formation area by a first distance, and forming first electrodes at the subpixels, respectively, forming a first organic common layer on the first electrodes such that the first organic common layer covers at least the active area, forming light emitting layers at the subpixels on the first organic common layer, respectively, forming a second organic common layer on the light emitting layers such that the second organic common layer has an area equal to or greater than the first organic common layer, forming a second electrode on the second organic common layer, removing the second electrode, the second organic common layer and the first organic common layer from the area extending from the camera hole formation area by the first distance, forming a barrier layer over the substrate, to cover the active area and the peripheral area, and removing the substrate and an upper configuration disposed on the substrate from the camera hole formation area, thereby forming a camera hole.

The method can further include inserting a camera lens into the formed camera hole, and mounting a camera module to a bottom of the substrate in an area corresponding to the camera hole such that a camera bezel included in the camera module, to drive the camera lens while supporting the camera lens, overlaps with the substrate by the first distance.

It is to be understood that both the foregoing general description and the following detailed description of the present invention are explanatory and are intended to provide further explanation and examples of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain principles of the invention. In the drawings.

DETAILED DESCRIPTION OF THE EMBODIMENTS

Figure 1:
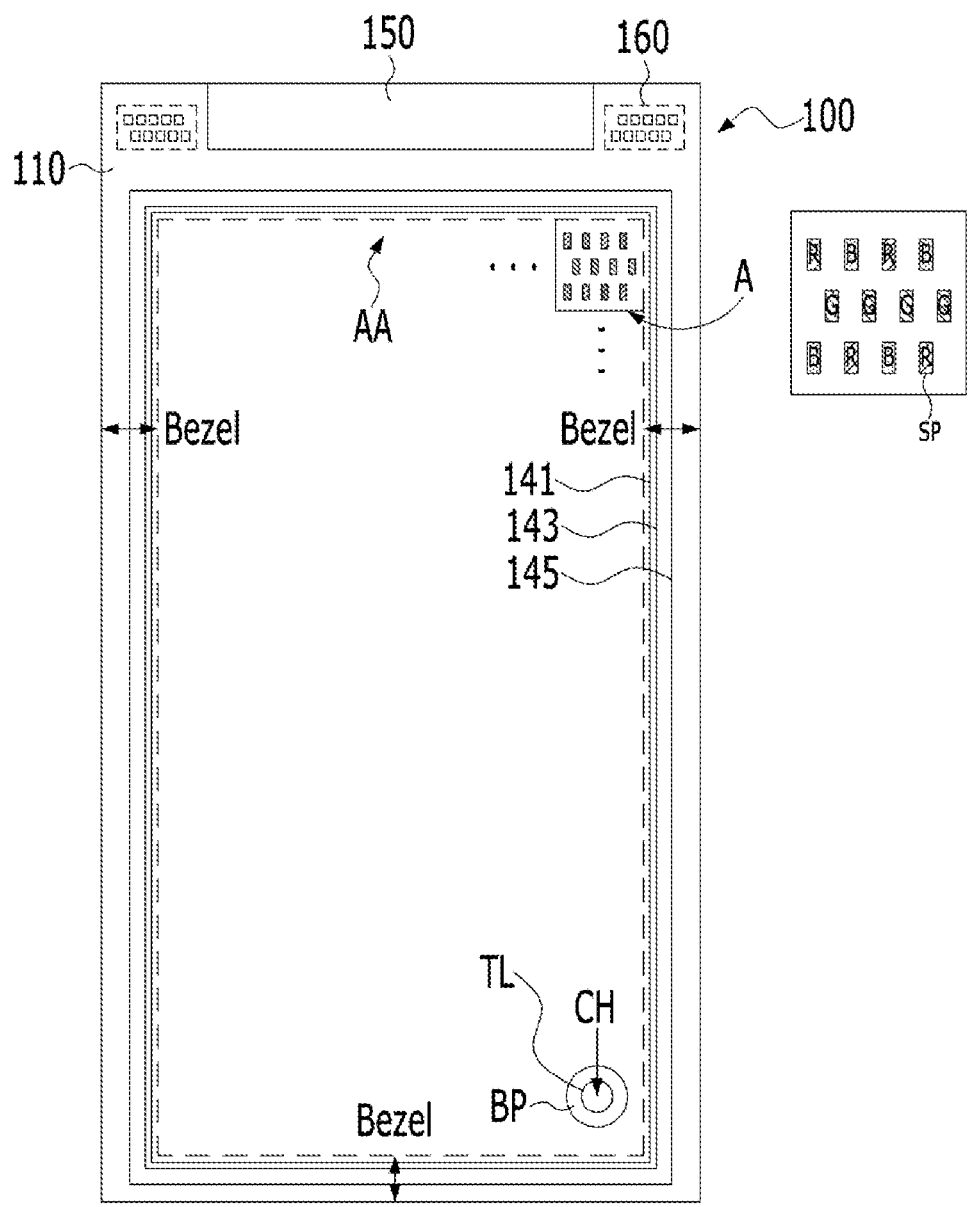
FIG. 1 is a plan view illustrating an organic light emitting display device according to an embodiment of the present invention.

Hereinafter, example embodiments of the present invention will be described in detail with reference to the accompanying drawings. In the description given with reference to the accompanying drawings, the same reference numerals designate the same constituent elements, respectively. In the following description of the present invention, a detailed description of known functions and configurations incorporated herein will be omitted when it may obscure the subject matter of the present invention. Furthermore, the following terms associated with constituent elements are selected taking into consideration for easy understanding and preparation of the disclosure, and may differ from the names of the corresponding elements in practice.

The shape, size, ratio, angle, number and the like shown in the drawings to illustrate the embodiments of the present invention are only for illustration and are not limited to the contents shown in the drawings. Wherever possible, the same reference numbers will be used throughout the drawings to refer to the same or like parts. In the following description, detailed descriptions of technologies or configurations related to the present invention may be omitted so as not to unnecessarily obscure the subject matter of the present invention. When terms such as "including", "having" and "comprising" are used throughout the specification, an additional component may be present, unless "only" is used. A component described in a singular form encompasses components in a plural form unless particularly stated otherwise.

It should be interpreted that the components included in the embodiment of the present invention include an error range, although there is no additional particular description thereof.

In describing a variety of embodiments of the present invention, when terms for positional relationship such as "on," "above," "under" and "next to" are used, at least one intervening element may be present between two elements unless "right" or "direct" is used.

In describing a variety of embodiments of the present invention, when a temporal relationship is described, for example, when terms for temporal relationship of events such as "after," "subsequently," "next," and "before" are used, there may also be the situation in which the events are not continuous, unless "immediately" or "directly" is used.

In addition, although terms including an ordinal number, such as first or second, may be used to describe a variety of constituent elements, the constituent elements are not limited to the terms, and the terms are used only for the purpose of discriminating one constituent element from other constituent elements.

The respective features of various embodiments according to the present invention can be partially or entirely joined or combined and technically variably related or operated, and the embodiments can be implemented independently or in combination.

Figure 2:
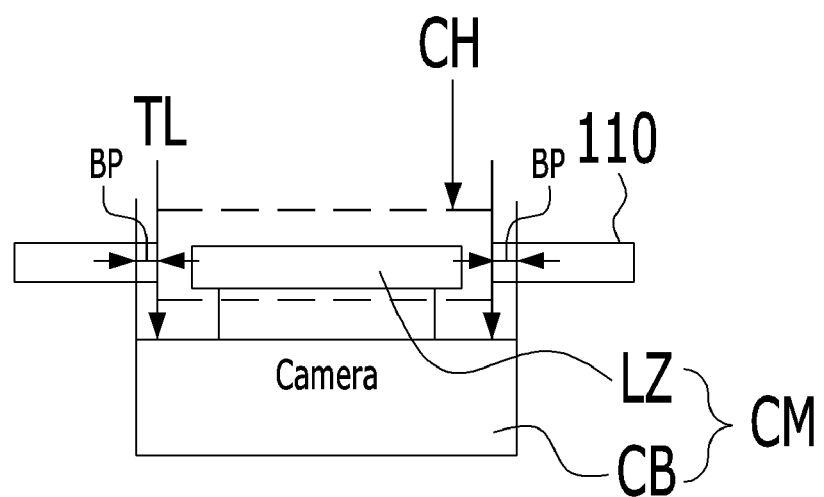
FIG. 2 is a sectional view illustrating a camera module, a camera hole corresponding to the camera module, and an area around the camera hole according to an embodiment of the present invention.
Figure 3:
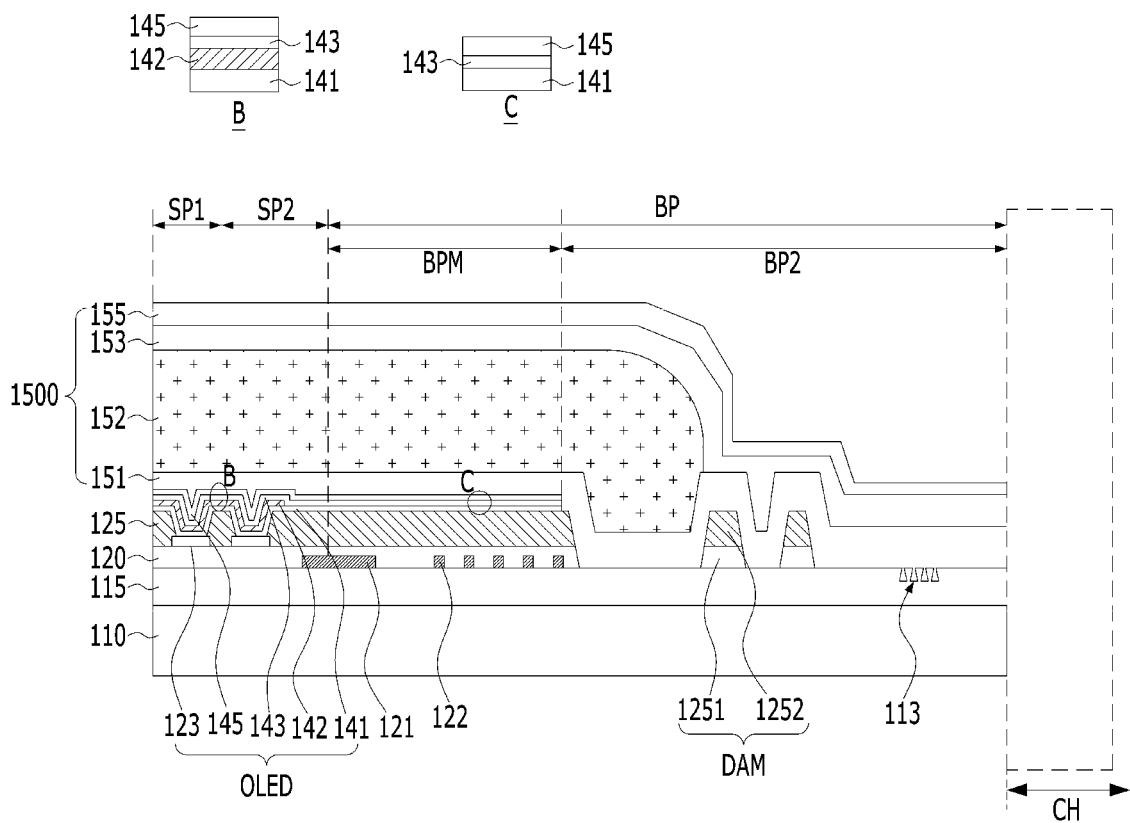
FIG. 3 is a sectional view illustrating the camera hole of FIG. 1, and a camera bezel and an active area around the camera hole, which are arranged in accordance with an embodiment of the present invention.
Figure 4A:
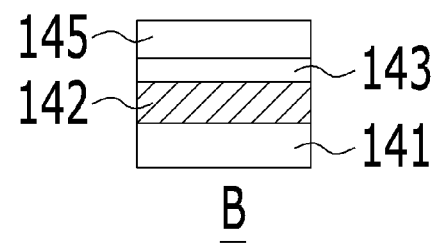
FIGS. 4A and 4B are sectional views illustrating regions B and C in FIG. 3, respectively, according to an embodiment of the present invention.
Figure 4B:
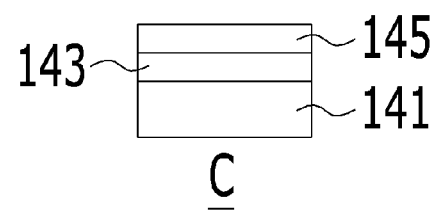
Figure 5A:
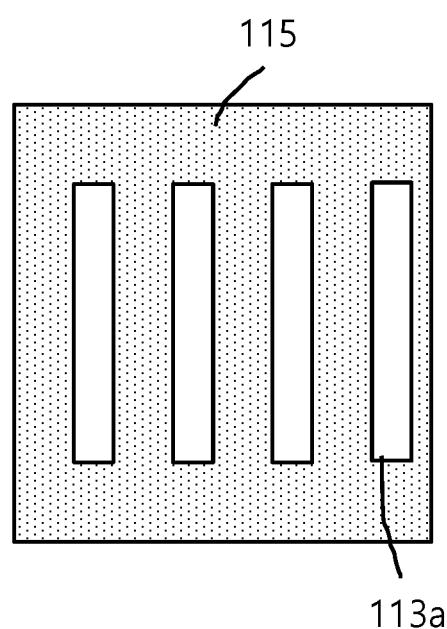
FIGS. 5A to 5C are plan views illustrating various examples of an anti-crack pattern of FIG. 3, according to embodiments of the present invention.
Figure 5B:
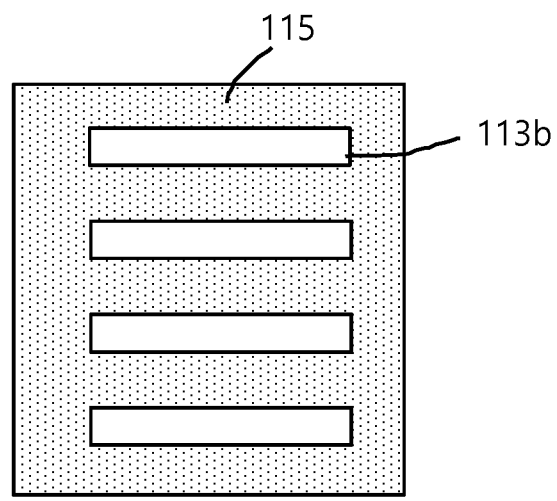
Figure 5C:
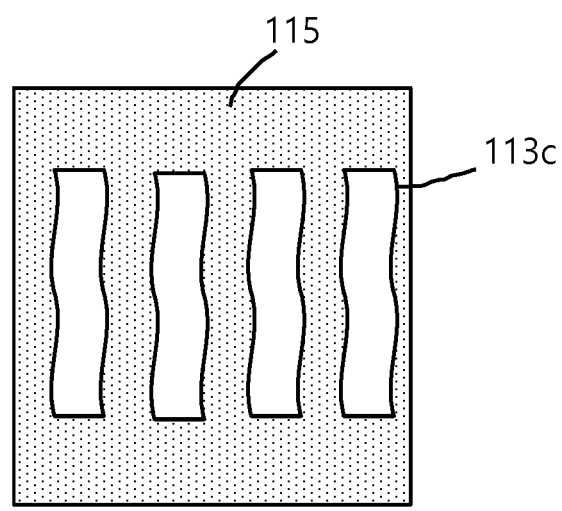

FIG. 1 is a plan view illustrating an organic light emitting display device according to embodiments of the present invention. FIG. 2 is a sectional view illustrating a camera module, a camera hole corresponding to the camera module, and an area around the camera hole. FIG. 3 is a sectional view illustrating the camera hole of FIG. 1, and a camera bezel and an active area around the camera hole, which are arranged in accordance with a first embodiment of the present invention. FIGS. 4A and 4B are sectional views illustrating regions B and C in FIG. 3, respectively. FIGS. 5A to 5C are plan views illustrating various examples of an anti-crack pattern of FIG. 3.

FIGS. 1 to 3 illustrate an application of a display device according to the first embodiment of the present invention to an organic light emitting display device 100. The organic light emitting display device 100 includes various constituent elements formed on a substrate 110. The substrate 110 is divided into an active area AA (an area inside a broken line in FIG. 1) including a plurality of subpixels, to achieve screen display, and a peripheral area Bezel surrounding the active area AA.

The planar shape of the active area AA shown in FIG. 1 is substantially rectangular, but is not limited thereto. The active area AA may have various planar shapes. In most situations, the active area AA occupies an inner portion of the substrate 110 inwardly spaced from an edge of the substrate 110 by a predetermined width while having a shape similar to that of the substrate 110.

A plurality of subpixels SP is arranged in the active area AA. As can be seen from a region A in FIG. 1, each subpixel SP includes red (R), green (G) and blue (G) light emitting elements, and these elements are repeatedly arranged in the active area AA. In the organic light emitting display device 100 of FIG. 1, each light emitting element includes a first electrode, a second electrode, and an organic light emitting diode (OLED) interposed between the first electrode and the second electrode while including a plurality of organic emission layers. The OLED performs light emission and, as such, the display device is referred to as an "organic light emitting display device" in accordance with material characteristics of the organic emission layers. As another example, there may be a display device in which light emission layers are made of an inorganic material and, as such, form inorganic emission layers. In this situation, the display device, in which each subpixel includes a light emitting element constituted by a light emitting diode having inorganic emission layers, may be referred to as an "inorganic light emitting display device. Even in such an inorganic light emitting display device, other layers present between the electrodes and the inorganic emission layers may be made of an organic material.

In a light emitting diode structure having organic common layers formed through application of an open mask during formation of the light emitting diode, to cover at least an active area, the organic common layers may be exposed along an edge of a camera hole due to the process as described above and, as such, may form a moisture penetration path. The display device of the present invention is configured to avoid such a phenomenon. In this regard, the shape of an area around a camera hole in the display device of the present invention can be applied to not only the illustrated organic light emitting display device, but also other light emitting display devices, so long as the light emitting display devices have a structure including organic common layers and a camera hole disposed in an active area.

In addition, the light emitting display device according to the illustrated embodiment of the present invention has a feature in that a camera module CM for performing a photographing operation, in addition to image display, is disposed in the active area AA.

As illustrated in FIG. 2, the camera module CM includes a camera lens LZ inserted into a camera hole CH formed through the active area AA of the substrate 110, and a camera bezel CB for supporting the camera lens LZ while having a driver.

In this situation, the active area AA of the substrate 110 includes a plurality of subpixels SP each including emission layers in a region except for the camera hole CH and a first space BP for protecting an area around the camera hole CH.

The camera bezel CB is disposed at a lower portion of the substrate 110, as compared to the camera lens LZ inserted into the camera hole CH, and is attached to the substrate 110 or a separate support member, and, as such, the cameral bezel CB is coupled to the substrate 110. To this end, the camera bezel CB overlaps with the substrate 110 by a distance corresponding to the first space BP around the cameral hole CH. In FIG. 1, the separate support member between the substrate 110 and the camera bezel CB is omitted.

In addition, the camera hole CH is an open area from which the substrate 110 and an upper configuration disposed on the substrate 110 are removed. The camera lens LZ of the camera module CM is inserted into the open area.

In FIG. 1, "TL" designates a trimming line. The trimming line TL is a boundary of the substrate 110 to be left when a portion of the substrate 110 corresponding to the camera hole CH and upper and lower configurations thereof are removed through laser cutting, drilling, or punching in an associated process. The trimming line TL corresponds to an edge of the camera hole CH.

As such, in the organic light emitting display device 110 of the present invention, the camera module CM is disposed in the active area AA. Accordingly, it may be possible to eliminate a spatial margin from the peripheral area Bezel, except for configurations of pads. In addition, there may be an advantage, as compared to the situation in which the camera module is disposed in the peripheral area, in that it is unnecessary to increase the physical size of the peripheral area, for example, width and height, in order to hide the camera module. When a plurality of camera modules should be provided, a first camera module can be disposed in the peripheral area, and a second camera module can be disposed in a camera hole provided in the active area, as illustrated above. Even in the latter situation, there may be an advantage, as compared to a camera module configuration in which a plurality of camera modules is disposed in the peripheral area, in that it is possible to solve a problem of an increase in peripheral area to avoid interference among the plural camera modules disposed in the peripheral area, because camera modules are arranged in the areas separated from each other, respectively, in embodiments of the present invention.

In addition, as a configuration of the OLED included in each subpixel SP in the organic light emitting display device 110 of embodiments of the present invention, common layers 141 and 143 are provided between a first electrode 123 and a second electrode 145, in addition to an organic emission layer 142. Here, the reason why the layers 141 and 143 are referred to as "common layers" is because each of the layers 141 and 143 is formed in the form of an integrated layer to cover the entirety of at least the active area AA. Generally, the common layers 141 and 143 have hole or electron transport properties and, as such, assist in carrier transport to the organic emission layer 142 or directly perform carrier transport.

In the organic light emitting display device, the common layers 141 and 143 can be made of organic materials, respectively. If necessary, an inorganic common layer can be interposed between the organic common layers 141 and 143.

Furthermore, the OLED can include, at least one of the first organic common layer 141 between the organic emission layer 142 and the first electrode 123 and the second organic common layer 143 between the organic emission layer 142 and the second electrode 145. If necessary, the OLED ca include only one of the first and second organic common layers 141 and 143.

In addition, each or any one of the first and second organic common layers 141 and 143 can be constituted by multiple layers.

Furthermore, the second electrode 145 of the OLED in each subpixel SP is formed to have an integrated structure to cover the entirety of the active area AA, for application of a common voltage. Preferably, the second electrode 145 is formed to have the greatest area to cover all of the first and second organic common layers 141 and 143. As such, it can be possible to transmit a common voltage to the second electrode 145 through connection between the second electrode 145 and a line formed in a portion of the peripheral area Bezel.

In addition, when the first organic common layer 141 is a hole transport layer, and the second organic common layer 143 is an electron transport layer, the second organic common layer 143, which exhibits relatively superior interface matching with the second electrode 145, is formed to have a greater area than the first organic common layer 141, and, as such, the first organic common layer 141, which exhibits great resistance, does not contact the second electrode 145.

The subpixels SP are not arranged in an area around and immediately adjacent to the camera hole CH. That is, a protective area is provided to surround the camera hole CH while extending from the edge of the camera hole CH by a distance corresponding to the first space BP. The protective area is a non-emission area where no emission layer is arranged. The substrate 110 is coupled to the camera module CM while overlapping with the camera bezel CB of the camera module CM in the first space BP. The camera hole CH is an area from which the substrate 110 and an upper configuration disposed on the substrate 110 are removed, for insertion of the camera module CM into the substrate 110. This area is defined through a separate removal process conducted before a process for inserting the camera module CM.

In addition, in order to protect materials weak against moisture penetration among configurations formed on the substrate 110, the organic light emitting display device of the present invention is provided with a barrier 1500 (e.g., formed of barriers 151, 152, 153 and 155) formed such that an end of the barrier 1500 forms a boundary between the barrier 1500 and the camera hole CH. That is, the barrier 1500 not only has an end disposed along an edge of the peripheral area Bezel, but also the above-described end, which is disposed around the camera hole CH, to prevent lateral moisture penetration.

Figure 6:
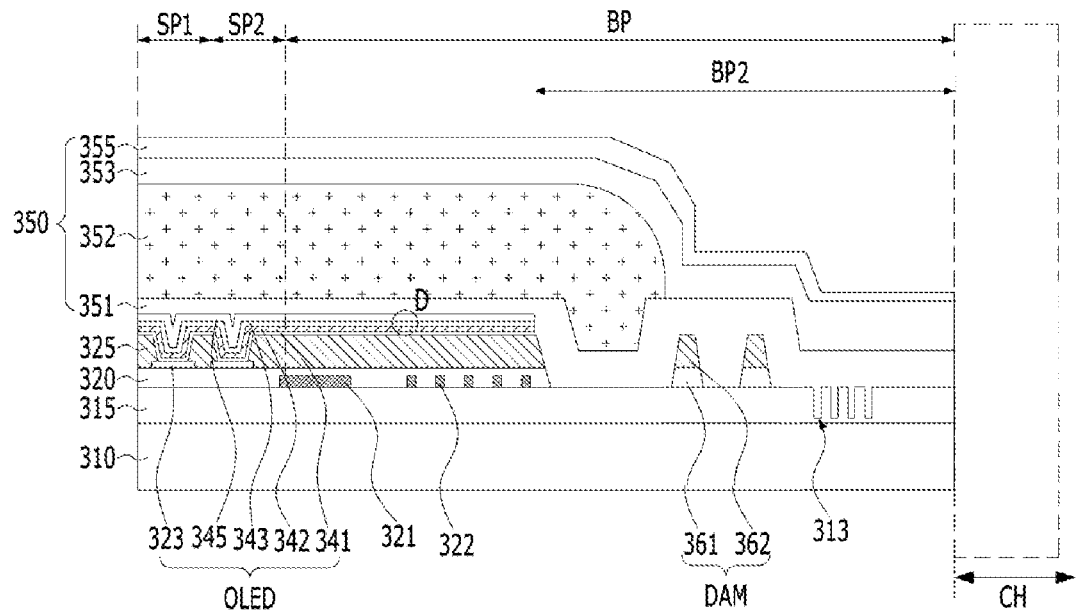
FIG. 6 is a sectional view illustrating an organic light emitting display device according to another embodiment of the present invention.

In addition, in the organic light emitting display device according to the illustrated embodiment of the present invention, each of the first and second organic common layers 141 and 143 and the second electrode 145 is primarily formed on the active area AA, to have an integrated structure, as described above and as illustrated in FIG. 3. However, the first and second organic common layers 141 and 143 and the second electrode 145 are defined to have intermittent portions in areas disposed around the edge of the camera hole CH while extending outwards from the edge of the camera hole CH by a distance corresponding to a second space BP2 (FIG. 6).

For example, intermittent portions can be formed in accordance with partial removal of the organic common layers 141 and 143 and, as such, can cut continuance of the organic common layers 141 and 143 between adjacent ones of the subpixels SP around the camera hole CH. In this situation, although moisture penetrates due to the configuration of the camera hole CH, the path, along which moisture flows, is blocked by the intermittent portions and as such, damage to he subpixels SP caused by moisture or foreign matter may be avoided. Upon forming the intermittent portions, portions of the organic common layers 141 and 143 corresponding to the second space BP2 can be completely removed, or can be partially left without being completely removed due to partial transmission of laser energy. In the former situation, it can be possible to achieve separation between the organic common layers of the subpixels and the organic common layers in the second space BP2 and, as such, transfer of moisture can be prevented. Even in the latter situation, the same effect as that of the former situation, that is, prevention of moisture transfer, can be obtained when the remaining portions of the organic common layers 141 and 143 have an island shape.

In another example, intermittent portions can be formed by removing the first and second organic common layers 141 and 143 and the second electrode 145 from a region defined around the edge of the camera hole CH while extending outwards from the edge of the camera hole CH by the distance corresponding to the second space BP2. Each of the first and second organic common layers 141 and 143 and the second electrode 145 is formed to have an integrated structure using an open mask and, as such, a portion thereof corresponding to the second space BP2 is removed through a selective removal process using laser radiation or the like. If necessary, portions of the first and second organic common layers 141 and 143 and the second electrode 145, which are disposed in a region where the camera hole CH is to be formed, can be removed simultaneously with configurations disposed in the second space BP2, for convenience of removal of the substrate 110 and an upper configuration disposed on the substrate 110 from the camera hole region upon subsequent formation of the camera hole CH.

In particular, the second electrode 145 can have an intermittent portion having the same shape as that of the second organic common layer 143, as illustrated in FIG. 3.

In addition, in the organic light emitting display device of the present invention, an additional camera module can be provided at a portion of the peripheral area Bezel, in addition to the camera module provided within the active area.

Hereinafter, the peripheral area Bezel will be described.

A portion of the peripheral area Bezel, which corresponds to one side of the substrate 110 (a top side in FIG. 1), has a relatively great width. At this peripheral area portion, a driver 150 connected to a plurality of pads, to drive a thin film transistor array and an organic emission array, and dummy pad parts 160 arranged at opposite sides of the driver 150, and electrically connected to a touch electrode array, to take part in driving of the touch electrode array, are disposed. The dummy pad parts 160 can be formed at the same layer as the plural pads over the substrate 110. The dummy pad parts 160 can be connected to the touch electrode array, which is disposed over the barrier 1500 of the organic light emitting display device.

In addition, the thin film transistor array means the entirety of thin film transistors included in respective subpixels in the active area, and the organic emission array means the entirety of the OLEDs included in respective subpixels.

A concrete layered structure will be described with reference to FIG. 3.

The substrate 110 can be formed using a flexible material such as a plastic film or a hard material such as a glass substrate. In the organic light emitting display device of embodiments of the present invention, however, it is preferred that the substrate 110 be made of a flexible plastic material in order to prevent horizontal transfer of impact occurring during a removal process for formation of the camera hole CH.

When the substrate 110 is formed using a plastic film, the organic light emitting display device can further include a buffer layer 115 formed to directly contact the substrate 110 while having an inorganic stack including a plurality of inorganic layers, for surface protection and film formation uniformity of the substrate 110. In addition, the buffer layer 115 can further have an active buffer layer for protection of active layers of thin film transistors to be formed thereon. In FIG. 3, the buffer layer 115 is illustrated in a state in which the organic stack and the active buffer layer are merged into the buffer layer 115. Although the buffer layer 115 is illustrated as a single layer, the buffer layer 115 has a multilayer structure including a plurality of inorganic layers. The inorganic layers used for the buffer layer can include a silicon insulating film, such as a silicon oxide film, a silicon nitride film or a silicon oxynitride film, or a metal oxide film, such as an aluminum oxide film or a titanium oxide film. When the inorganic layers included in the buffer layer 115 include a metal oxide film, the metal oxide film is spaced apart, by one layer or more, from each thin film transistor (an active layer, a gate electrode, a source electrode, and a drain electrode), which is disposed over the buffer layer 115, in order to avoid electrical influence on the thin film transistor.

In addition, the buffer layer 115 can further include a concave anti-crack pattern 113 formed on at least one of the plural inorganic layers around the camera hole CH. The anti-crack pattern 113 disperses stress horizontally transferred from the edge of the camera hole CH. The anti-crack pattern 113 also functions to disperse bending force applied to the substrate 110 having flexibility during execution of an associated process while preventing concentration of the bending force on a particular area. For such a function, the anti-crack pattern 113 is formed to be disposed adjacent to the camera hole CH.

In addition, although a groove of the anti-crack pattern 113 is illustrated in FIG. 3 as having vertical side walls aiming an acute angle with respect to a bottom surface of the groove, the present invention is not limited thereto. For example, the side walls can be perpendicular to the bottom surface or can form a slightly obtuse angle with respect to the bottom surface. In this situation, it is preferred that the vertical side walls of the groove in the anti-crack pattern 113 be perpendicular to the bottom surface or can form an acute angle with respect to the bottom surface, in order to cut continuance of the organic common layers at boundaries of the anti-crack pattern 113 in formation of the OLEDs.

The anti-crack pattern 113 has a concave shape when viewed in vertical cross-section thereof, as illustrated in FIG. 3. The anti-crack pattern 113 also has various horizontal shapes, for example, a plurality of columns 113a as shown in FIG. 5A, a plurality of rows 113b as shown in FIG. 5B, or a plurality of zig-zag patterns 113c (e.g., wavy patterns) as shown in FIG. 5C.

Further, in addition to the anti-crack pattern 113, which is disposed in the first space BP around the camera hole CH, an additional anti-crack pattern having a shape similar or identical to that of the anti-crack pattern 113 can be provided at the peripheral area Bezel in order to cut a transfer path of stress from the outside of the device.

The organic light emitting display device can further include a planarization layer 120 formed over the buffer layer 115, which includes a thin film transistor array including a data line 121 and a plurality of power lines 122.

First electrodes 123 corresponding to respective subpixels SP are formed on the planarization layer 120.

Banks 125 are also formed on respective first electrodes 123 at boundaries of respective subpixels SP, to define light emitting elements.

In addition, the double-layer structure of the banks 125 and the planarization layer 120 disposed beneath the banks 125 is patterned, to form dam patterns (DAM) 1251 and 1252 in the first space BP around the camera hole CH.

On the first electrode 123 corresponding to each subpixel SP, the first organic common layer 141, the organic emission layer 142, the second organic common layer 143 and the second electrode 145 are sequentially formed in this order and, as such, an OLED is completely formed.

When adjacent ones of the subpixels SP are configured to emit different colors, the organic emission layers 142 of the adjacent subpixels SP can include light emitting layers for emitting different colors, for example, red, green, blue, etc., for the corresponding subpixels SP, respectively. In connection with this, deposition masks having different opening areas are prepared for formation of light emitting layers for different colors in an associated process, and a deposition process is carried out for each of different color emitting materials, and, as such, red, green, and blue light emitting layers can be selectively formed for respective adjacent subpixels SP.

As described above, the first and second organic common layers 141 and 143 and the second electrode 145 are layers formed to cover at least the active area. The reason why these layers have intermittent portions around the camera hole CH is because, after completion of the layer formation process up to formation of the second electrode 145, a removal process is separately carried out for the second electrode 145, the second organic common layer 143 and the first organic common layer 141, which have been formed in common. In particular, the second electrode 145, the second organic common layer 143 and the first organic common layer 141 are spaced apart from the edge of the camera hole CH by a distance corresponding to the second space BP2 and, as such, it can be possible to prevent the organic layers, which are weak against moisture or ambient air, from being exposed at a cut part, such as the camera hole CH during execution of a process, after completion of manufacture, or in use. In this situation, after completion of the layer formation process up to formation of the second electrode 145, the second electrode 145 is removed, together with the first and second organic common layers 141 and 143, from the first space BP, using a method such as laser ablation, in order to prevent the second organic common layer 143 from being exposed in the removal process. The process for formation of constituent elements of each OLED up to formation of the second electrode 145 is carried out in a vapor deposition manner, using an open mask having an opening excluding the peripheral area Bezel, except for formation of the organic emission layer 142. In this situation, each layer has a thin film shape while having a film quality of low density and, as such, can be removed even by low laser radiation energy in an ultraviolet wavelength range corresponding to a wavelength range of about 340 to 370 nm. In this situation, the first and second organic common layers 141 and 143 are peeled off from surfaces of the banks 125 or the surface of the buffer layer 120 by laser energy applied thereto. The second electrode 145, which has a film quality of high density, as compared to the first and second organic common layers 141 and 143, is also removed, together with the first and second organic common layers 141 and 143, in accordance with separation of the first and second organic common layers 141 and 143 from the banks 125 and the buffer layer 120. In other words, parts of the organic layer can be lasered away, so that the edges of the organic layers can terminate a safe distance away from the camera hole (e.g., the edges of the organic layers are too close to the hole, then this situation can invite moisture penetration and degradation of the device).

In addition, when the second electrode 145 is formed as a reflective/transmissive electrode, in which the organic light emitting display device is of a top emission type, the second electrode 145 is formed to have a thickness of 140 Å or less in order to achieve an enhancement in transmissivity. In this situation, the second electrode 145 can have a smaller thickness than the first and second organic common layers 141 and 143 and, as such, can be easily removed, together with the first and second organic common layers 141 and 143, in a laser ablation process for removal of the first and second organic common layers 141 and 143.

The barrier 1500 includes a first barrier 151 formed over the entire surface including the OLEDs of the subpixels SP and the dam patterns DAM disposed in the first space BP while being made of an inorganic film material, a second barrier 152 disposed in an area inside the dam patterns DAM while being thicker than the first barrier 151 and made of an organic film material, and third and fourth barriers 153, 155 sequentially formed over the second barrier while being made of an inorganic material. For example, barrier 1500 can include a first barrier 151, a second barrier 152, a third barrier 153 and a fourth barrier 155.

Referring to the above description, among the constituent elements of the barrier 1500, only the second barrier 152 is made of an organic material, and is disposed in an area inside the dam patterns DAM while being spaced apart from the edge of the camera hole CH. In this situation, positional adjustment of the second barrier 152 is possible in accordance with provision of the dam patterns DAM. The dam patterns DAM have a height of about 2 μm or more and, as such, function to prevent the material of the second barrier 152 from flowing to the camera hole CH during formation of the second barrier 152, even when the material of the second barrier 152 has flowability. In accordance with this configuration, among the layers of the barrier 1500, the second barrier 152, which is made of an organic material exhibiting superior protective ability against foreign matter, but weak against moisture penetration, is prevented from meeting the edge of the camera hole CH (e.g., the edge of the second barrier 152 is sealed within the other barrier layers 151, 153 and 155).

Among the constituent elements of the barrier 1500, the first barrier 151, the third barrier 153, and the fourth barrier 155 meet the edge of the camera hole CH. Similarly, in the peripheral area Bezel, the barriers 151, 153 and 155 of the barrier 1500, which are made of inorganic materials, extend to lateral edges of the peripheral area Bezel, to protect side portions of the second barrier 152, and as such, lateral moisture penetration can be prevented.

The area occupied by the first and second organic common layers 141 and 143 within the first space BP is a bezel margin area BPM. This area has a width equal to the width of the bank 125 formed at a boundary of the subpixel SP23 most adjacent to the camera hole CH. If necessary, the width of the bank 125 formed at the boundary of the subpixel SP2 most adjacent to the camera hole CH can be reduced to a minimum width and, as such the bank 125 can be substantially eliminated. In this situation, the bezel margin area BPM can be approximate to zero and, as such, the first space BP, which is a protective area around the camera hole CH, can be substantially equal to the second space BP2, in which the intermittent portions of the first and second common layers 141 and 143 are defined.

In addition, the second electrode 145 can be left in the first space BP, if necessary. In this situation, the second electrode 145 can be formed after selective removal of the first and second organic common layers 141 and 143.

FIG. 6 is a sectional view illustrating an organic light emitting display device according to a second embodiment of the present invention.

The organic light emitting display device according to the second embodiment of the present invention differs from that of the first embodiment in that an organic emission layer 342 is primarily formed in the form of a common layer to cover the active area AA, like a white organic emission layer, and is then removed, together with organic common layers 341 and 342 and a second electrode 345, to form intermittent portions around the camera hole in a laser ablation process described in conjunction with FIG. 3. The remaining configurations of FIG. 6 are identical to those of FIG. 3.

In addition, each OLED further includes a layer formed on the second electrode, to achieve an enhancement in light extraction while protecting the OLED, like a capping layer. Such a capping layer may be primarily formed in the form of a common layer to cover the active area AA, and is then removed, together with the organic common layers and the second electrode, in a laser ablation process.

Figure 7:
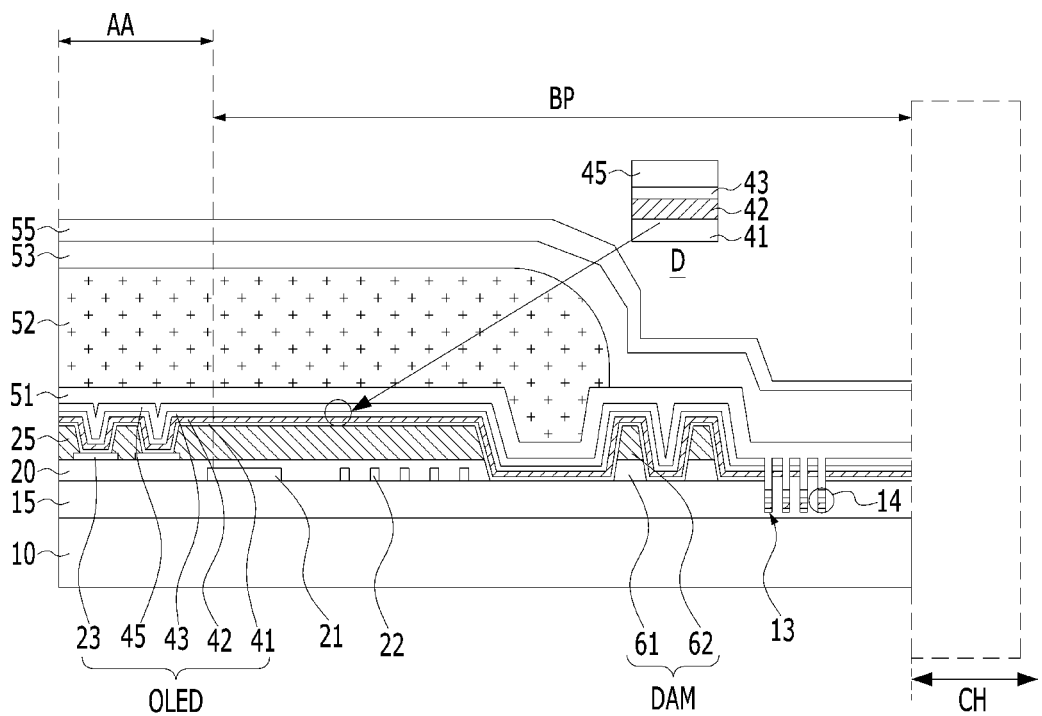
FIG. 7 is a sectional view illustrating an organic light emitting display device according to a comparative example compared to that of FIG. 3.

FIG. 7 is a sectional view illustrating an organic light emitting display device according to a comparative example compared to that of FIG. 3.

As illustrated in FIG. 7, the organic light emitting display device according to the comparative example has a structure including a first organic common layer 41, a second light emitting layer 42, a second organic common layer 43, and a second electrode 45. In this structure, the first organic common layer 41, the second light emitting layer 42, the second organic common layer 43 and the second electrode 45, which are constituent elements of the OLED disposed in a camera edge area, are left in grooves 13 of a buffer layer 15 within an area around the camera hole CH. As a result, there may be a possibility that lateral moisture penetration around the camera hole CH may occur through the first and second organic common layers 41 and 43 and the second light emitting layer 42.

In order to avoid lateral moisture penetration around the camera hole CH in the above-described comparative example, in the organic light emitting display device of embodiments of the present invention, intermittent portions are formed at the organic common layers, to be disposed around the edge of the camera hole CH in an area corresponding to the first space BP while extending outwards from the edge of the camera hole CH by a distance corresponding to a second space BP2 (e.g., portions of the organic common layers around the camera hole CH are removed, similar to a firebreak—in a fire fighting analogy, or a moat ditch—in a castle analogy). As a result, the films that directly contact or meet the camera hole CH around the camera hole CH are only inorganic films (e.g., no organic films meet or contact the camera hole).

The configuration, in which the organic common layers have intermittent portions around the camera hole, as in the first and second embodiments of the present invention, is not limited to the above-described organic light emitting display device. This configuration may also be applied to an inorganic light emitting display device using an organic common layer.

Figure 8:
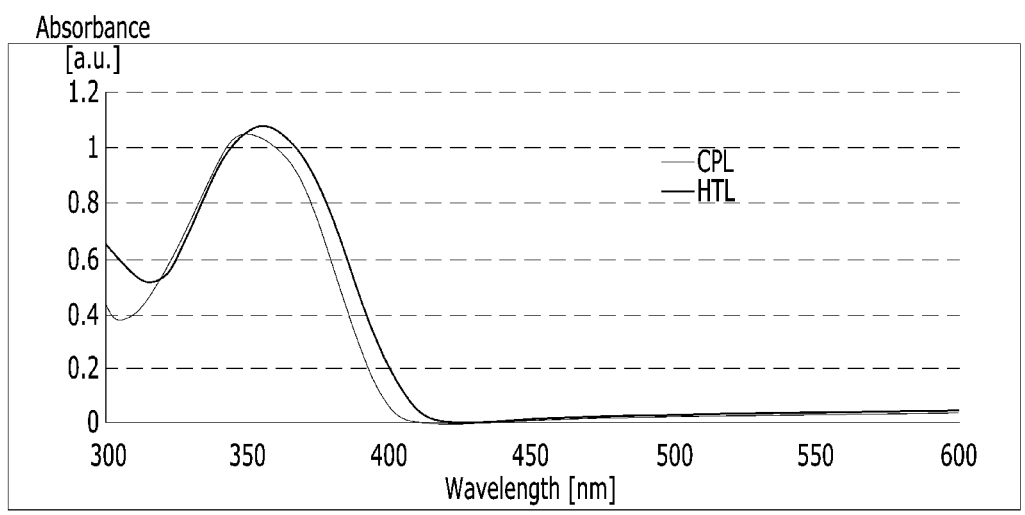
FIG. 8 is a graph depicting light absorbances of materials in the organic light emitting display device at different wavelengths, according to an embodiment of the present invention.

FIG. 8 is a graph depicting light absorbances of materials in the organic light emitting display device of embodiments of the present invention at different wavelengths.

A laser having a wavelength within an ultraviolet wavelength range is mainly used when a laser ablation process is carried out for removal of the first and second organic common layers from the second area BP2 in the organic light emitting display device of the present invention described in conjunction with FIG. 3. This means that materials exhibiting high light absorbances within an ultraviolet wavelength range are selected for layers to be removed. Referring to the graph of FIG. 8, it can be seen that light absorbances of a hole transport layer HTL and a capping layer CPL exhibit high light absorbances in an ultraviolet wavelength range, respectively.

Here, the hole transport layer HTL is a layer included in the first organic common layer, and the capping layer CPL is a layer formed on the second electrode ("145" in FIG. 3). If necessary, the capping layer CPL on the second electrode 145 can be formed to cover the active area AA, and can then be applied to a removal process, together with the first and second organic common layers, before formation of the barrier 1500.

The capping layer CPL is a layer formed to contact an upper surface of the second electrode 145, and provided to achieve an enhancement in light extraction while protecting an OLED disposed therebeneath. The capping layer CPL can be made of the same material as the second organic common layer contacting a lower surface of the second electrode 145, taking into consideration matching thereof with the second electrode 145.

In the organic light emitting display device of the present invention, the organic common layers, which are removed through laser ablation, are made of materials exhibiting high absorbances for the wavelength of light used in the laser ablation, respectively.

Hereinafter, a method for manufacturing an organic light emitting display device of the present invention will be described with reference to the accompanying drawings.

FIGS. 9A to 9D are sectional views illustrating the method for manufacturing an organic light emitting display device of the present invention. FIGS. 10A to 10D are plan views of a substrate respectively corresponding to FIGS. 9A to 9D.

Figure 9A:
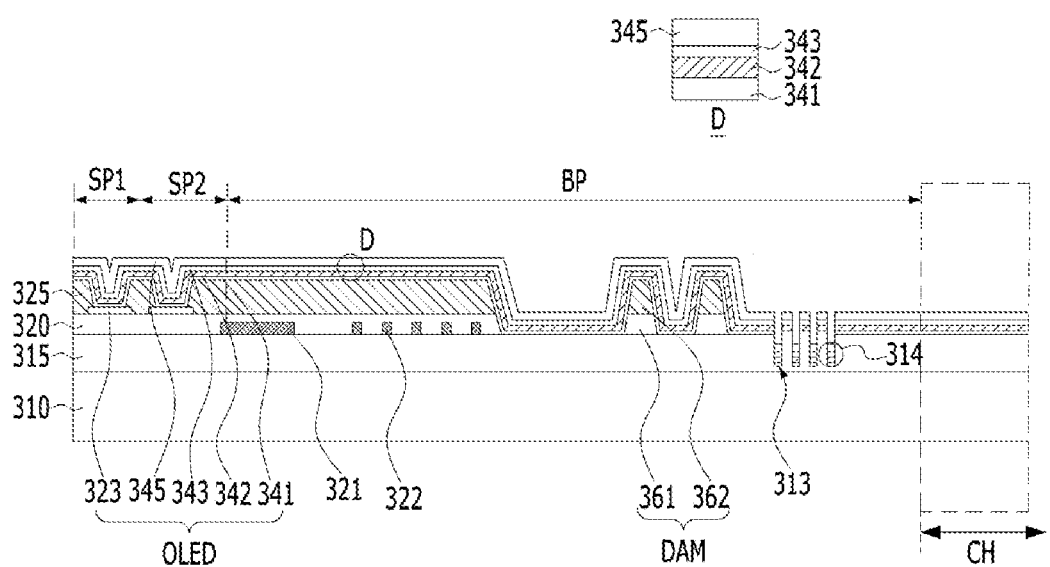
FIGS. 9A to 9D are sectional views illustrating a method for manufacturing an organic light emitting display device, according to an embodiment of the present invention.
Figure 10A:
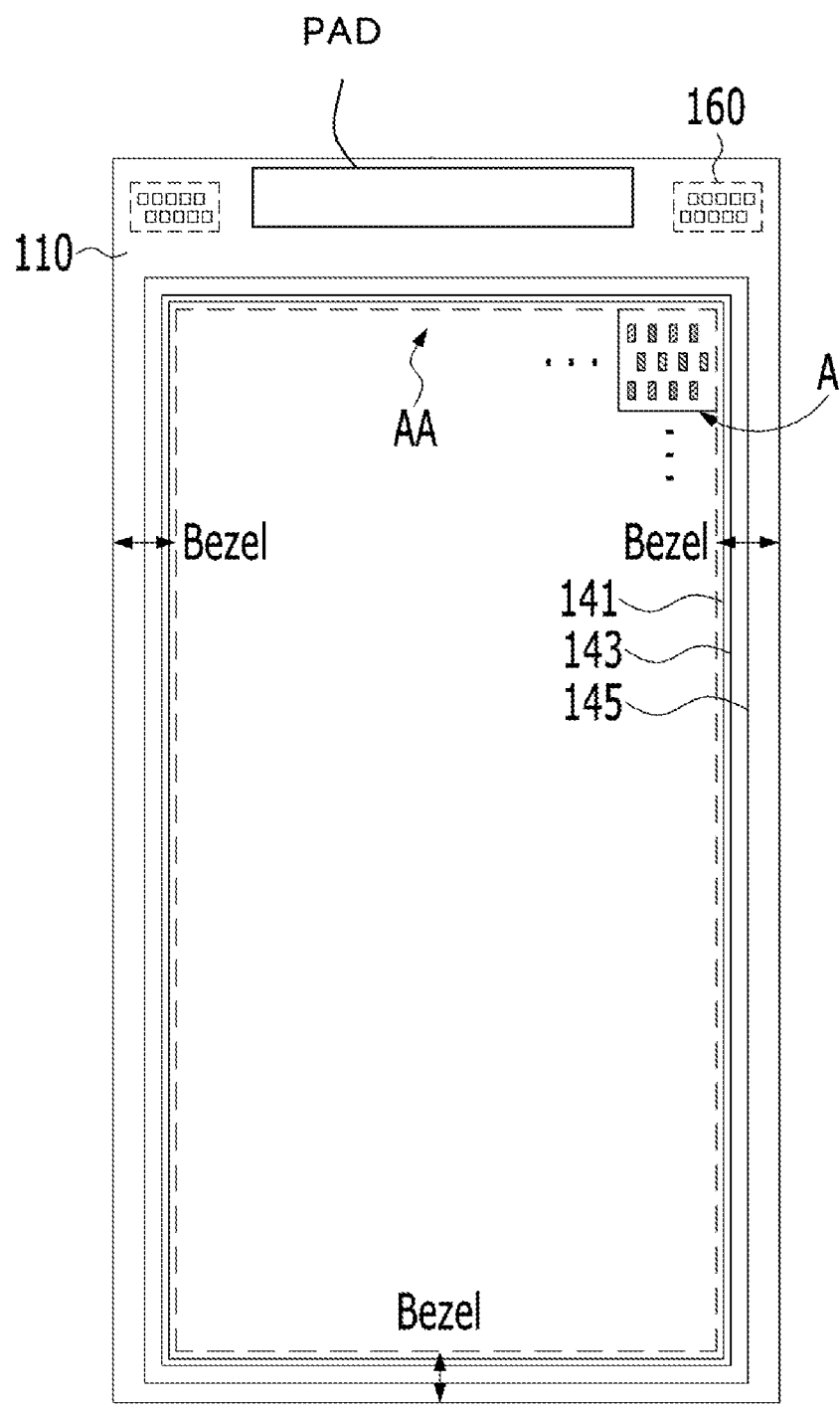
FIGS. 10A to 10D are plan views of a substrate respectively corresponding to FIGS. 9A-9d, according to an embodiment of the present invention.

As illustrated in FIGS. 9A and 10A, a buffer layer 315, which is constituted by a plurality of inorganic films layered to form a multilayer structure, is formed over a substrate 310. At least one of the multiple inorganic layers in the buffer layer 315 is formed with a concave anti-crack pattern 313 around an area corresponding to a camera hole CH. The anti-crack pattern 313 disperses stress horizontally transferred from an edge of the camera hole CH, which will be formed in a subsequent removal process. The anti-crack pattern 313 also functions to disperse bending force applied to the substrate 310 having flexibility during execution of an associated process while preventing concentration of the bending force on a particular area. For such a function, the anti-crack pattern 313 is formed to be disposed adjacent to the camera hole CH.

In addition, although a groove of the anti-crack pattern 313 is illustrated in FIG. 9A as having vertical side walls perpendicular to a bottom surface of the groove, the present invention is not limited thereto. For example, the side walls can be perpendicular to the bottom surface or may form an acute angle or a slightly obtuse angle with respect to the bottom surface. In this situation, it is preferred that the vertical side walls of the groove in the anti-crack pattern 313 be perpendicular to the bottom surface or can form an acute angle with respect to the bottom surface, as illustrated in FIG. 9A, in order to cut continuance of organic common layers at boundaries of the anti-crack pattern 313 in formation of the OLEDs. In addition, the depth of the groove in the anti-crack pattern 313 can be varied in accordance with the number of inorganic layers where the groove of the buffer layer 315 is disposed.

The anti-crack pattern 313 has a concave shape when viewed in vertical cross-section thereof, as illustrated in FIG. 9A. The anti-crack pattern 313 also has various horizontal shapes, for example, a plurality of columns 113a, a plurality of rows 113b, or a plurality of zig-zag or wavy patterns 113c, as described in conjunction with FIGS. 5A to 5C.

Further, in addition to the anti-crack pattern 313, which is disposed in a first space BP around the camera hole CH, an additional anti-crack pattern having a shape similar or identical to that of the anti-crack pattern 313 cam be provided at a peripheral area Bezel in order to cut a transfer path of stress from the outside of the device.

Thereafter, a thin film transistor array including a gate electrode (lines), an active layer, a data line 321, and a plurality of power lines 322 is formed on the buffer layer 315 having the anti-crack pattern 313. The thin film transistor array may further include an interlayer insulating film interposed between layers of the gate electrode (line), active layer, data line 321 and multiple power lines 322.

In this situation, as shown in FIG. 10A, a pad part PAD including a plurality of pads and dummy pad parts 160 taking part in touch driving can be further formed at the peripheral area Bezel during formation of the thin film transistor array A planarization layer 320 is then formed over the buffer layer 315 including the thin film transistor array having the data line 321 and the plural power lines 322.

First electrodes 323 corresponding to respective subpixels are subsequently formed on the planarization layer 320.

Banks 325 are also formed on respective first electrodes 323 at boundaries of respective subpixels SP, to define light emitting elements.

The double-layer structure of the banks 325 and the planarization layer 320 disposed beneath the banks 325 is subsequently patterned, to form dam patterns (DAM) 361 and 362 in the first space BP around the camera hole CH.

On the first electrode 323 corresponding to each of the subpixels SP1, SP2, . . . , a first organic common layer 341, an organic emission layer 342, a second organic common layer 343 and a second electrode 345 are sequentially formed in this order and, as such, an OLED is completely formed.

When adjacent ones of the subpixels SP1, SP2, . . . are configured to emit different colors, the organic emission layers 342 of the adjacent subpixels SP can include light emitting layers for emitting different colors, for example, red, green, blue, etc., to the corresponding subpixels SP, respectively. In connection with this, deposition masks having different opening areas are prepared for formation of light emitting layers for different colors in an associated process, and a deposition process is carried out for each of different color emitting materials, and, as such, red, green, and blue light emitting layers may be selectively formed for respective adjacent subpixels SP. Referring to FIG. 9A, the organic emission layers 342 are shown as being formed not only on the subpixels SP1, SP2, . . . , but also on an area therearound, in a continuous manner. This situation corresponds to, for example, the situation in which a white organic emission layer is applied as the organic emission layer 342 of each subpixel. As illustrated in FIG. 9A, the white organic emission layer 342 is formed, together with the first organic common layer 341 and the second organic common layer 343, over the entirety of an active area AA including a camera hole formation area and an area therearound such that the OLEDs have these layers in common. That is, the white organic emission layer 342 is formed to cover the entirety of the active area AA, similarly to the organic common layers described in conjunction with FIG. 1. In this situation, after completion of a process for forming a barrier 350 or 1500 to be described later, color filters corresponding to respective subpixels are formed on the white organic emission layer 342, to enable emission of different colors from the subpixels, and, as such, display of different colors at different subpixels may be possible.

Of course, the organic emission layers can include light emitting layers of different colors for different subpixels, as described above in conjunction with FIG. 3. In the situation of FIG. 3, such a light emitting layer may not be selectively provided in the area corresponding to the camera hole CH and the area corresponding to the first space BP around the camera hole CH in accordance with opening adjustment for light emitting layers.

Figure 9B:
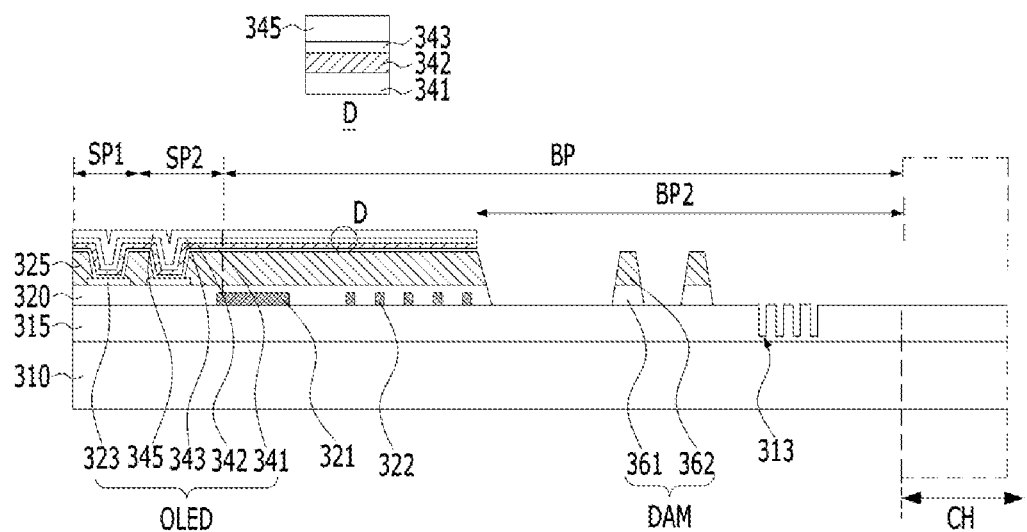
Figure 10B:
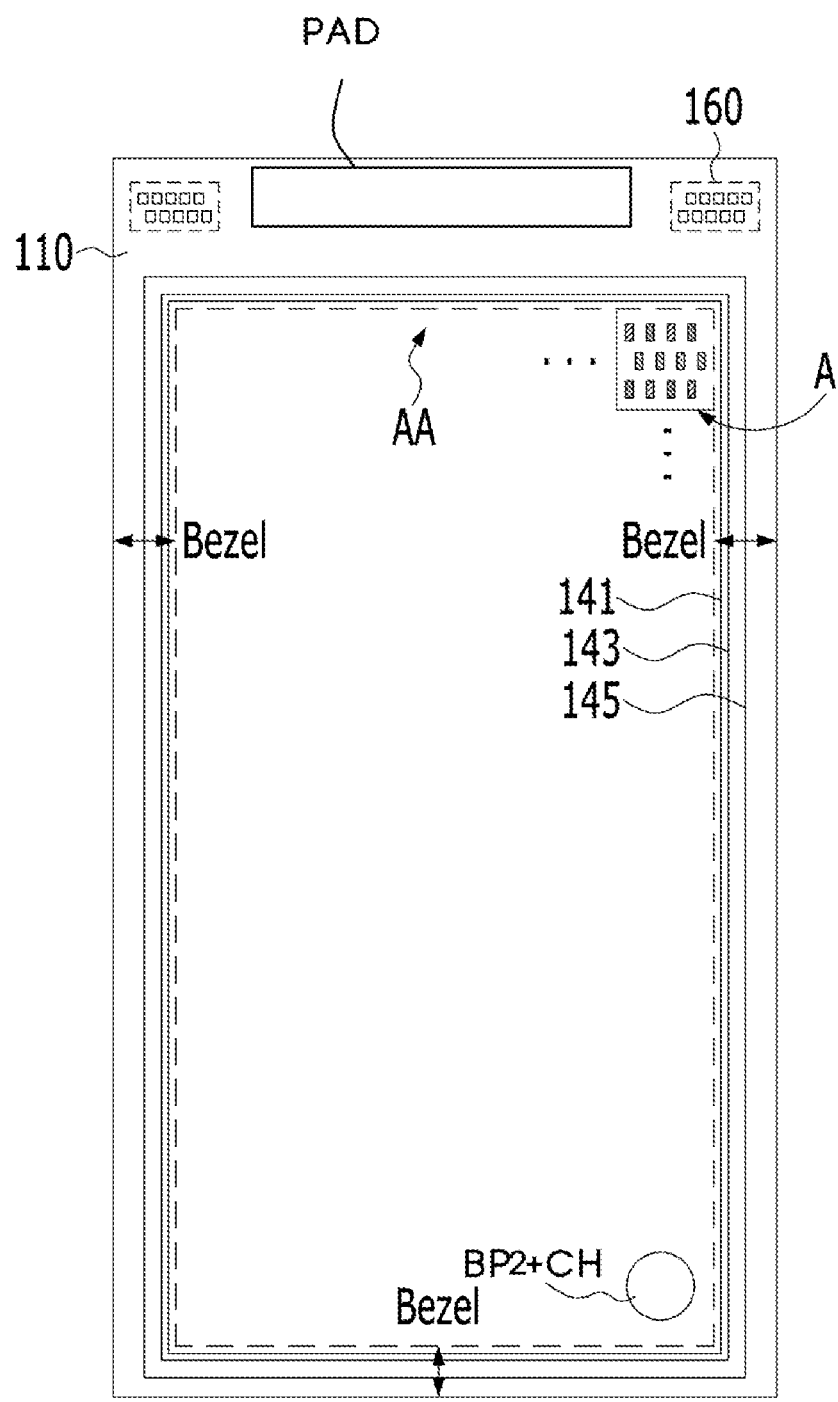
Figure 10C:
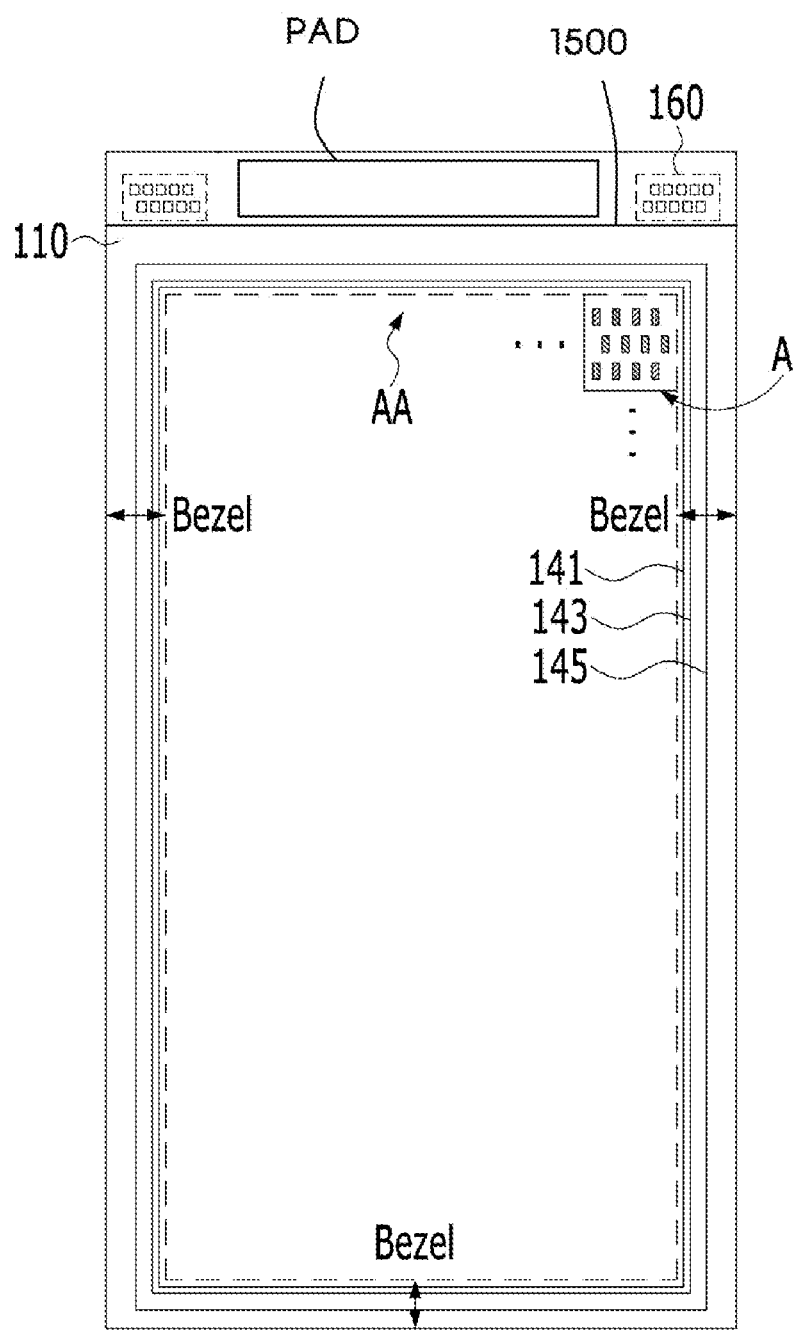

Subsequently, in order to provide intermittent portions at the constituent elements of each OLED weak against moisture in an area around the camera hole formation area, as illustrated in FIGS. 9B and 10B, a laser in an ultraviolet wavelength range is irradiated onto upper surface portions of the resultant structure obtained after the second electrode 345 is formed, which correspond to the camera hole formation area and an area corresponding to the second space BP2 around the camera hole CH, to perform ablation (CH+BP2). As a result, the second electrode 345, and the second organic common layer 343, the organic emission layer 342 and the first organic common layer 341, which are disposed beneath the second electrode 345, can be simultaneously removed from the camera hole formation area and the area therearound. If necessary, the process for selective OLED removal can be carried out after formation of a capping layer CPL over the second electrode 345. In this situation, the capping layer CPL is formed as a common layer having an area greater than or equal to an area of the second electrode 345.

When ablation is carried out through the above-described laser radiation, interface separation occurs between the first organic common layer 341, the second organic common layer 343 or the capping layer CPL, which directly contacts the first and second electrodes 323 and 345, and the first and second electrodes 323 and 345. As a result, organic materials are separated from the upper surface of the first electrode 323 and, as such, are removed. In order to effectively perform the above-described ablation, it is preferred that the first organic common layer 341, the second organic common layer 343 or the capping layer, which directly contacts the first and second electrodes 323 and 345, be made of an organic material exhibiting excellent light absorbance in a wavelength of energy in laser radiation used in the process. Through this process, organic materials weak against moisture are removed from the camera hole formation area and the area therearound.

Figure 9C:
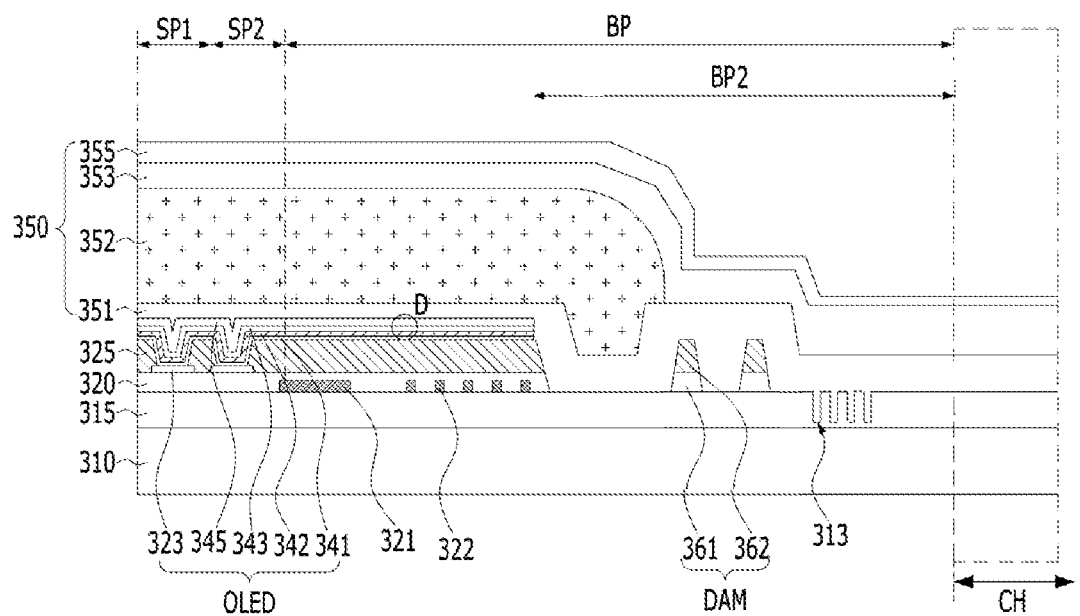

Thereafter, a barrier ("350" in FIG. 9C and "1500" in FIG. 10C) is formed over the entire upper surface of the resultant structure including the OLEDs of the subpixels and the dam patterns DAM disposed in the area corresponding to the first space BP. The barrier includes a first barrier 351 made of an inorganic film material, a second barrier 352 disposed in an area inside the dam patterns DAM while being thicker than the first barrier 351 and made of an organic film material, and third and fourth barriers 353 and 355 sequentially formed over the second barrier 352 while being made of an inorganic material. Referring to FIG. 9C, the arrangement of the barrier 1500 in the peripheral area Bezel can be seen. The barrier 1500 extends to an area except for the pad part PAD and the dummy pad parts 160. In detail, when, among the constituent elements of the barrier 1500, only the second barrier 352 is made of an organic material, the second barrier 352 is disposed inwards of the remaining barriers, that is, the first barrier 351, the third barrier 353 and the fourth barrier 355, in order to protect side portions of the second barrier 352 made of an organic material by the first barrier 351, the third barrier 353 and the fourth barrier 355, which are made of inorganic materials.

Figure 10D:
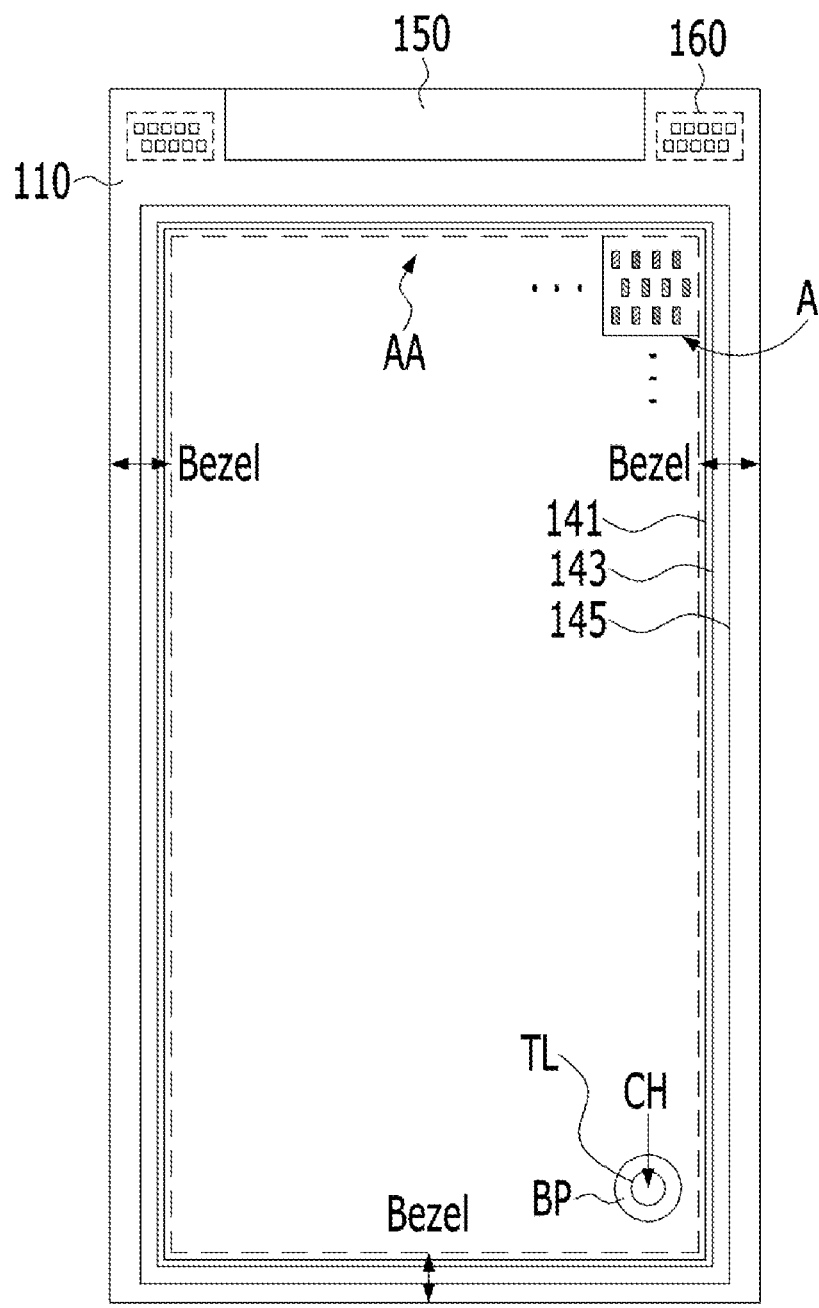

Subsequently, a driver 150 to be connected to the pad part PAD can be formed, as illustrated in FIG. 10D.

Figure 9D:
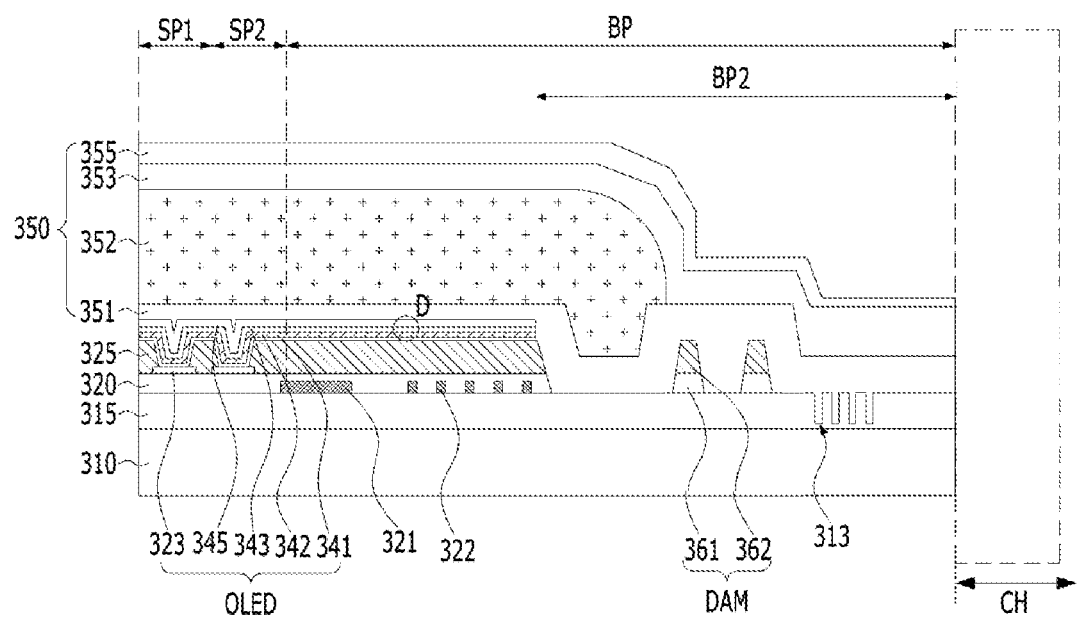

As illustrated in FIGS. 9D and 10D, a portion of the substrate 110 corresponding to the camera hole formation area and an upper configuration thereof are removed along a trimming line TL through a physical process, such as punching, drilling, or laser cutting.

In order to protect a lower configuration of the substrate 110 before the removal process, a protective film made of, for example, polyethylene terephthalate (PET) can be further formed. In this situation, the removal process can remove not only the upper configuration of the substrate 110, but also the lower configuration of the substrate 110. Through the removal process, the area, which is disposed inside the trimming line TL and from which the substrate 110 is removed, becomes the camera hole CH. The trimming line TL becomes the edge of the camera hole CH. A camera module ("CM" in FIG. 2) can be inserted into the camera hole CH.

As can be seen from FIG. 9D, in the area around the edge of the camera hole CH, there is no organic material, and only the barrier 350 (or "1500 in FIG. 10C) made of an inorganic material is present to surround the camera hole CH. Accordingly, external moisture penetration into the active area AA through the camera hole CH can be prevented. Thus, reliability of the device may be enhanced.

As apparent from the above description, the display device of the present invention is configured to cut continuance of organic common layers in a structure including a camera in a display part (active area), thereby blocking a moisture or foreign matter penetration path around a camera hole. Accordingly, reliability of the device can be enhanced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display device comprising:
   a substrate having an active area and a peripheral area surrounding the active area;
   a camera hole disposed in the active area of the substrate;
   a plurality of subpixels disposed in the active area while being spaced apart from the camera hole by a first distance, the plurality of subpixels including a plurality of light emitting layers, respectively;
   at least one organic common layer disposed on or under the plurality of light emitting layer; and
   a camera module including a camera lens corresponding to the camera hole, and a camera bezel for supporting the camera lens, the camera bezel overlapping with the substrate by the first distance in an area beneath the substrate,
   wherein the at least one organic common layer includes an intermittent portion corresponding to a second distance from the camera hole, the second distance being less than or equal to the first distance.

2. The display device according to claim 1, wherein the intermittent portion is a hole in the at least one organic common layer, or
   wherein the intermittent portion is a barren spot in the at least one organic common layer, the barren spot being free of the at least one organic common layer.

3. The display device according to claim 1, wherein the at least one organic common layer has an integrated structure in the active area, except for in areas corresponding to the intermittent portion and the camera hole.

4. The display device according to claim 1, wherein the at least one organic common layer includes a first organic common layer disposed under the plurality of light emitting layers, and a second organic common layer disposed on the plurality of light emitting layers,
   wherein the first organic common layer contacts a first electrode in each of the plurality of subpixels, and
   wherein the second organic common layer contacts a second electrode in each of the plurality of subpixels.

5. The display device according to claim 4, wherein the second electrode has an intermittent portion having a diameter substantially equal to a diameter of an intermittent portion of the second organic common layer.

6. The display device according to claim 4, wherein the first organic common layer, the second organic common layer and the cathode, respectively, have the intermittent portion having a diameter substantially equal, and
   wherein at the peripheral area, the second organic common layer is wider than the first organic common layer, and the cathode is wider than the second organic common layer.

7. The display device according to claim 4, further comprising:
   a buffer layer disposed on the substrate, the buffer layer having an anti-crack pattern within an area inside the second distance from the camera hole; and
   a barrier layer disposed on the substrate, the barrier layer overlapping with the active area including the plurality of subpixels and the peripheral area,
   wherein grooves of the anti-crack pattern are filled with the barrier layer.

8. The display device according to claim 7, wherein the anti-crack pattern includes a plurality of grooves arranged in the buffer layer, each of the plurality of grooves having a zig-zag shape, a wavy shape, or a curvy shape in a plane.

9. The display device according to claim 7, wherein the buffer layer includes:
   a plurality of inorganic stacks disposed adjacent to the substrate; and
   an active buffer layer disposed on the plural inorganic stacks, the active buffer layer being disposed over or beneath a semiconductor layer provided in the active area.

10. The display device according to claim 1, wherein the at least one organic common layer is absent from an area surrounding the camera hole, and
    wherein an edge of the at least one organic common layer is spaced apart from an edge of the camera hole by the second distance.

11. The display device according to claim 1, further comprising:
    a dam pattern disposed within an area of the second distance from the camera hole, the dam pattern being spaced apart from the camera hole and the at least one organic common layer.

12. The display device according to claim 11, wherein the plurality of subpixels are divided from one another by banks, respectively, and the dam pattern includes a same material as the banks.

13. The display device according to claim 1, further comprising:
    a buffer layer disposed on the substrate,
    a barrier layer over the substrate, the barrier layer overlapping with the active area including the plurality of subpixels and the peripheral area,
    wherein the barrier layer contacts the buffer layer within an area of the second distance from the camera hole.

14. The display device according to claim 13, wherein the barrier layer includes at least one organic layer and at least one inorganic layer.

15. The display device according to claim 14, wherein the camera hole contacts only the at least one inorganic layer among the at least one organic layer and the at least one inorganic layer of the barrier layer.

16. The display device according to claim 1, wherein the substrate is a flexible substrate.

17. The display device according to claim 1, wherein the at least one organic common layer includes material having light absorbance within a wavelength range.

18. The display device according to claim 1, wherein the camera hole is positioned adjacent to one corner of the active area having a rectangular shape.

19. A display device comprising:
- a substrate having an active area including a plurality of subpixels and a peripheral area surrounding the active area, the peripheral area being free of subpixels;
- a buffer layer disposed on the substrate;
- an organic common layer disposed in the plurality of subpixels;
- a camera hole disposed in the active area of the substrate;
- a barrier layer disposed on the plurality of subpixels, the barrier layer including:
  - a first inorganic barrier layer disposed on the plurality of subpixels,
  - a second inorganic barrier layer disposed on the first inorganic barrier layer, and
  - an organic barrier layer disposed between the first and second inorganic barrier layers;
- an intermittent portion in which the organic common layer is not formed on the buffer layer, corresponding to a predetermined distance from an edge of the camera hole; and
- a camera module including a camera lens corresponding to the camera hole, and a camera bezel for supporting the camera lens, the camera bezel overlapping with the substrate by a distance greater than or equal to the predetermined distance in an area beneath the substrate,
- wherein the first and second inorganic barrier layers extend to the edge of the camera hole, and the first inorganic barrier layer contacts the buffer layer within the intermittent portion, and
- wherein the organic barrier layer is spaced apart from the camera hole.

20. The display device according to claim 19, wherein the organic common layer has a hole at a region including the camera hole and the intermittent portion is a hole.

21. The display device according to claim 19, further comprising:
- an anti-crack pattern disposed in the intermittent portion,
- wherein grooves of the anti-crack pattern are filled with the first inorganic barrier layer.

* * * * *